United States Patent
Hartmann et al.

(10) Patent No.: US 11,031,323 B2
(45) Date of Patent: Jun. 8, 2021

(54) INTERCONNECTING MEMBER FOR POWER MODULE

(71) Applicant: ABB Power Grids Switzerland AG, Baden (CH)

(72) Inventors: Samuel Hartmann, Staufen (CH); Dominik Truessel, Bremgarten (CH); Fabian Fischer, Baden (CH)

(73) Assignee: ABB Power Grids Switzerland AG, Baden (CH)

( * ) Notice: Subject to any disclaimer, the term of this patent is extended or adjusted under 35 U.S.C. 154(b) by 58 days.

(21) Appl. No.: 16/558,906

(22) Filed: Sep. 3, 2019

(65) Prior Publication Data
US 2019/0393135 A1  Dec. 26, 2019

Related U.S. Application Data

(63) Continuation of application No. PCT/EP2018/055219, filed on Mar. 2, 2018.

(30) Foreign Application Priority Data

Mar. 3, 2017  (EP) .................................... 17159030

(51) Int. Cl.
*H01L 23/498* (2006.01)
*H01L 23/02* (2006.01)
(Continued)

(52) U.S. Cl.
CPC ............ *H01L 23/498* (2013.01); *H01L 23/02* (2013.01); *H01R 4/34* (2013.01); *H01R 31/06* (2013.01)

(58) Field of Classification Search
CPC ......... H01L 23/498; H01L 23/02; H01R 4/34; H01R 31/06
See application file for complete search history.

(56) References Cited

U.S. PATENT DOCUMENTS 5,744,861 A    4/1998  Bayerer
6,196,884 B1 *  3/2001  Tanaka ................. H01R 13/187
                                                    439/847
(Continued)

FOREIGN PATENT DOCUMENTS

CN    201421842 Y    3/2010
CN    202797558 U    3/2013
(Continued)

OTHER PUBLICATIONS

European Patent Office, International Search Report & Written Opinion issued in corresponding Application No. PCT/EP2018/055219, dated Apr. 4, 2018, 12 pages.

*Primary Examiner* — Peniel M Gumedzoe
(74) *Attorney, Agent, or Firm* — Slater Matsil, LLP

(57) ABSTRACT

A housing of a power module includes: an encasing for encasing semiconductor elements inside the housing; a power terminal area on the encasing, on which a power terminal plate is provided; an auxiliary terminal area on the encasing at a lower level than the power terminal area; and an interconnecting member with a power terminal connector part and an auxiliary terminal connector part interconnected by a spring part, the spring part is aligned besides the power terminal plate; the interconnecting member is inserted with the power terminal connector part through an opening in the encasing below the power terminal plate, such that the spring part engages the power terminal area besides the power terminal plate and runs to the auxiliary terminal area and the auxiliary terminal connector part is disposed on the auxiliary terminal area.

20 Claims, 4 Drawing Sheets

(51) Int. Cl.
  *H01R 31/06*     (2006.01)
  *H01R 4/34*      (2006.01)

(56)       References Cited

U.S. PATENT DOCUMENTS

2001/0042638 A1*   11/2001  Yamada ................ H01L 23/433
                                                          174/260
2011/0189902 A1*   8/2011   Haans .................... H01R 12/57
                                                          439/816
2015/0295336 A1    10/2015  Cole et al.
2016/0035651 A1    2/2016   Leung et al.
2016/0057881 A1    2/2016   Tada et al.

FOREIGN PATENT DOCUMENTS

CN          105321919 A        2/2016
CN          105575925 A        5/2016
CN          105990284 A        10/2016
DE           19612516 A1       5/1997
DE       102014115812 A1       5/2016
WO         2012107482 A2       8/2012

* cited by examiner

INTERCONNECTING MEMBER FOR POWER MODULE

FIELD OF THE INVENTION

The invention relates to a housing of a power module with an interconnecting member, a use of an interconnecting member for providing an auxiliary terminal of a power module, and a method of providing a housing of a power module with an auxiliary terminal.

BACKGROUND OF THE INVENTION

Power modules usually comprise one or more power semiconductors and a mechanical support structure for the power semiconductors, which also provide terminals for electrically connecting the circuitry formed by the power semiconductors with other power modules into a larger system, such as an electrical converter.

One possibility of a mechanical support structure is a housing or encasing, which may be formed of plastics, in which the power semiconductors are accommodated. Power terminals and auxiliary terminals may be provided on an outside of the housing. The auxiliary terminals may be used for connecting the gates of the power semiconductors and/or for connecting sensors inside the power module. For example, for a half-bridge module with two power semiconductor switches, the auxiliary terminals may provide connections for a gate and auxiliary emitter for the low side switch and the high side switch to control the switches and a thermistor terminal to sense the temperature of the integrated thermistor.

Sometimes it may be beneficial to provide further additional auxiliary terminals, which duplicate the main emitter terminals. These terminals may be used to detect failure events for protecting the power module. For example, the voltage difference between the duplicated main emitter and the auxiliary emitter may be measured which can be related to a current change, i.e. dI/dt within the corresponding power terminals. These additional auxiliary terminals are not wished and used in all applications. For example, leaving away these additional terminals may free up space on a driver board for implementing the driver circuit.

CN 202797558 U describes a flexible short circuit bridge used to short circuit gate and auxiliary emitter terminals of an IGBT module.

DE 10 2014 115 812 A1 shows a power module with a housing having elevated power terminals with respect to an area on which auxiliary terminals are provided.

DE 196 12 516 A1 shows U-shaped interconnection terminals, for connecting control connections of a power module with a connection rail. The terminals are soldered with their ends to the respective elements.

US 2015/295 336 A1 shows arms to contact power rails on a circuit board. The arms are biased against the power rails.

DESCRIPTION OF THE INVENTION

It is an objective of the invention to provide optional auxiliary terminals for a power module, which are simple to install without high additional costs.

This objective is achieved by the subject-matter of the independent claims. Further exemplary embodiments are evident from the dependent claims and the following description.

An aspect of the invention relates to a housing of a power module. A power module may be any type of module mechanically supporting one or more power semiconductor elements and for providing terminals for the one or more power semiconductor elements. The term "power" may relate to modules and/or semiconductor elements that are adapted for processing currents of more than 10 A and/or voltages of more than 100 V. The housing of the power module may relate to the parts of the power module, which protects the one or more semiconductor elements from the environment and which provide terminals electrically interconnected with components inside the power module, such as the one or more power semiconductor elements and/or other components, such as a sensor.

According to an embodiment of the invention, the housing comprises: an encasing for encasing semiconductor elements inside the housing; a power terminal area on the encasing, on which a power terminal plate is provided; and an auxiliary terminal area on the encasing at a lower level than the power terminal area.

The encasing may be a plastics encasing, which on a terminal side or front side provides the power terminal area and the auxiliary terminal area. On a backside, the encasing may be connected to a further mechanically supporting structure. The power terminal area and/or the auxiliary terminal area may comprise substantially parallel planes, which are spaced apart from each other. The power terminal area may be provided from a part of the encasing that protrudes from the encasing.

The power terminal plate may be provided by the end of a conductor, which runs inside the encasing and/or which may be electrically interconnected with a power semiconductor element inside the encasing.

For example, the power module may comprise one or more IGBTs or other semiconductor switches as semiconductor elements. An auxiliary terminal on the auxiliary terminal area may be a gate terminal for connection of a gate of such a semiconductor switch. Also, the power module may comprise a half-bridge of two series connected semiconductor switches. The power terminal may provide connections to the DC+, DC− and AC potentials of the half-bridge.

Furthermore, the housing comprises an interconnecting member with a power terminal connector part and an auxiliary terminal connector part interconnected with a spring part, wherein the spring part is aligned besides the power terminal plate.

The interconnecting member may be a formed metal sheet, which is inserted into the encasing. Contrary to this, the power terminal connector part may be cast into the encasing. The power terminal connector part may be inserted below the power terminal plate. The spring part may be seen as a flexible portion between the auxiliary terminal connector part and the power terminal connector part. The spring part is plastically bent into a form that is adapted to be engaged with the encasing, for example a protruding portion of the encasing providing the power terminal area. As will be described below, the spring part is elastically bent during insertion of the interconnecting member into the encasing, such that the auxiliary terminal connector part may be guided over the power terminal area.

Both the power terminal connector part and the auxiliary terminal connector part may be flat members. The spring part may be a tree-dimensionally shaped member.

The interconnecting member is inserted with the power terminal connector part through an opening in the encasing below the terminal plate, such that the spring part engages the power terminal area besides the power terminal plate and runs to the auxiliary terminal area. Furthermore, the auxiliary terminal connector part is disposed on the auxiliary terminal area.

The auxiliary connection area may be located in direction of insertion with respect to the power connection area, i.e. from this point of view behind the power terminal area and/or at an opposite side of the power terminal area with respect to the opening. The opening may be provided below the power terminal plate and/or furthermore may be used for accommodating a nut for screwing a conductor onto the power terminal plate.

When the power terminal connector part is inserted, the spring part is elastically bent, such that it may pass the power terminal area, which may be provided on a protruding portion of the encasing. When it is completely inserted, the auxiliary terminal connector part, by the spring force of the spring part, is disposed on the auxiliary terminal area, for example above an opening accommodating a nut used for attaching a conductor.

In such a way, with a simple designed and easy to mount member, an additional auxiliary terminal may be provided, which is electrically interconnected with the power terminal. The spring part is used as electrical conductor between the power terminal connector part and the auxiliary terminal connector part.

Furthermore, the spring part is plastically bent or formed, such that it at least partially runs on a higher level than the power terminal connector part. In such a way, an upper section of the spring part may engage the power terminal area on substantially the same level as the power terminal plate.

According to an embodiment of the invention, the spring part is plastically bent or formed, such that the auxiliary terminal connector part is positioned at a lower level than the power terminal connector part. The spring part may be formed that the auxiliary terminal connector part may be disposed nearly force-free on the auxiliary terminal area. It has to be noted that the auxiliary terminal connector part and the power terminal connector part may be substantially parallel aligned, however on different levels.

According to an embodiment of the invention, the spring part is plastically bent or formed, such that the spring part at least partially runs on a higher level than the power terminal connector part. In such a way, the spring part may be guided on top of the power terminal area, wherein the power terminal connector part may be arranged below the power terminal plate and/or below the level of the power terminal area.

According to an embodiment of the invention, a guidance structure for positioning the auxiliary terminal connector part on the auxiliary terminal area is provided in at least one of the auxiliary terminal area and the power terminal area. A guidance structure may be implemented on top of the power module. The auxiliary terminal connector part may be guided and/or positioned by this structure above an opening for connecting a conductor to the auxiliary terminal. The guiding structure may prevent a movement of the spring part in a sideward direction.

According to an embodiment of the invention, the guidance structure comprises protrusions or pins protruding from the auxiliary terminal area, between which protrusions the auxiliary terminal connector part is guided. These protrusions may be provided by the material of the encasing, which for example may be cast from a plastics material.

According to an embodiment of the invention, a nut is positioned below the power terminal plate in the encasing and the power terminal connector part is positioned between the power terminal plate and the nut. A conductor for electrically connecting to the power terminal may be screwed to the power module by the nut. The opening, into which the power terminal part of the interconnecting member is inserted, may be the opening for accommodating the nut. For example, the opening may have a rectangular shape and the nut may be a square nut, i.e. the opening may prevent the nut from turning.

When the conductor is screwed to the nut, the power terminal plate and the nut are pressed against the power terminal part, which is mechanically fixated in this way on the power module. Also, the power terminal plate and the power terminal connector part are electrically connected.

According to an embodiment of the invention, the power terminal connector part and the power terminal plate comprise a hole for a screw. The screw may be inserted through the power terminal plate and the power terminal connector part into the nut.

According to an embodiment of the invention, the auxiliary terminal connector part comprises a hole for a screw. Also the auxiliary terminal connector part may be fixated to the power module, when a conductor for electrically connecting to the auxiliary terminal is screwed to the housing.

According to an embodiment of the invention, a nut is positioned in an opening in the encasing below the auxiliary terminal connector part. A screw may be inserted through the auxiliary terminal connector part and the auxiliary terminal connector part may be screwed to the housing. It has to be noted that in this case, a part of the encasing may be between the nut and the auxiliary terminal connector part.

According to an embodiment of the invention, the interconnecting member is made of sheet metal. For example, the interconnecting member may be produced at low cost by stamping.

According to an embodiment of the invention, the interconnecting member is made of a spring steel alloy. In such a way, the spring part may be very elastic and may be bent elastically during the mounting procedure. After mounting, the interconnecting member may go back into its initial shape. No adjustments may be necessary anymore.

The following dimensions and properties have been found beneficial for designing an interconnecting member, which has the necessary stiffness, elasticity, mechanical stability and electrical conductivity.

According to an embodiment of the invention, a thickness of the interconnecting member is between 0.1 mm and 0.2 mm, for example 0.15 mm, and/or a Vickers hardness of the interconnecting member is at least HV 400.

According to an embodiment of the invention, a ratio of the length l of the spring part to a thickness t of the interconnecting member is 250 to 1000 times larger than a ratio of an orthogonal distance d between the power terminal area and the auxiliary terminal area to a length l of the spring part. For example, the ratio $(l/t)/(d/l)$ may be chosen as 500. The first factor $l/t$ may be seen related to a possible bending angle. The second factor $d/l$ may be seen related to a necessary bending angle. The orthogonal distance d may be the minimal distance between planes defined by the power terminal area and the auxiliary terminal area.

According to an embodiment of the invention, at least one further auxiliary terminal is provided on the auxiliary terminal area. This further auxiliary terminal may be integrated into the encasing, for example may be cast into the encasing. Possible auxiliary terminals may include gate terminals and sensor terminals.

According to an embodiment of the invention, the housing further comprises: a second power terminal area on the encasing, on which a second power terminal plate is provided. For example, the first power terminal area as described above may be an AC power terminal and the second power terminal area may be a DC+ and/or DC− power terminal area. Also the second power terminal area may be provided on a protruding portion of the encasing. Furthermore, a second power terminal plate may be provided on the second power terminal area, which second power terminal plate may be designed like the power terminal plate on the first power terminal area.

The second power terminal area may be at a higher level than the auxiliary terminal area and/or may be on the same level than the first terminal area. The auxiliary terminal area may be provided between the first power terminal area and the second power terminal area. In summary, power terminals may be provided on two opposite sides of the power module on an elevated area. One or more auxiliary terminals may be provided in the area between these two elevated areas.

There may be interconnecting members for providing one or more further auxiliary terminals that are also mounted to the housing by insertion of a power terminal connector part below a power terminal plate but that are differently designed.

According to an embodiment of the invention, the housing further comprises: a second interconnecting member with a second power terminal connector part and a second auxiliary terminal connector part protruding from the second terminal connector part.

The first interconnecting member may be seen as an interconnecting member of a first type and the second interconnecting member may be seen as an interconnecting member of a second type.

The second interconnecting member may not have a spring part. However, the second power terminal connector part and a second auxiliary terminal connector part of the second interconnecting member may be designed like the ones of the first interconnecting member.

According to an embodiment of the invention, the second interconnecting member is inserted with the second power terminal connector part through a second opening in the encasing below the second terminal plate, such that the second auxiliary terminal connector part is disposed on the auxiliary terminal area. In this case, the opening for the power terminal connector part may be facing the auxiliary terminal area and/or may be on the same level than the auxiliary terminal area.

According to an embodiment of the invention, the second interconnection member comprises an intermediate part interconnecting the second power terminal connector part and the second auxiliary terminal connector part. The intermediate part may be L-shaped and/or may be aligned orthogonal to the second power terminal connector part and the second auxiliary terminal connector part. The intermediate part may be used as a stopper for the insertion of the second power terminal connector part into the opening. Furthermore, with the intermediate part, the position of the second auxiliary terminal connector part with respect to the second power terminal connector part may be determined.

For example, the first interconnecting member may be used for providing a first auxiliary emitter terminal, which is electrically interconnected with the emitter of a high side semiconductor switch of a half-bridge. The second interconnecting member may be used for providing a second auxiliary emitter terminal, which is electrically interconnected with the emitter of the low side semiconductor switch of the half-bridge.

A further aspect of the invention relates to a use of an interconnecting member, as described in the above and in the following, for providing an auxiliary terminal of a power module. The interconnecting member may comprise a power terminal connector part and an auxiliary terminal connector part interconnected with a spring part. Furthermore, the spring part may be bent, such that it at least partially runs on a higher level than the power terminal connector part for engaging an encasing of the power module. Several interconnecting members may be used for providing several auxiliary terminals.

A further aspect of the invention relates to a method of providing a housing of a power module with an auxiliary terminal. For example, the method may be performed during manufacturing of the power module. A technician may insert the interconnecting member into the housing of the power module, when an additional auxiliary terminal is needed.

According to an embodiment of the invention, the method comprises: providing the housing with an encasing for encasing semiconductor elements inside the housing, a power terminal area on the encasing, on which a power terminal plate is provided and an auxiliary terminal area on the encasing at a lower level than the power terminal area; providing an interconnecting member with a power terminal connector part and an auxiliary terminal connector part interconnected with a spring part, wherein the spring part is aligned besides the power terminal connector part and wherein the spring part is formed, such that it at least partially runs on a higher level than the power terminal connector part; elastically bending the spring part, such that the auxiliary terminal connector part is at a higher level than the power terminal connector part; inserting the interconnecting member with the power terminal connector part through an opening in the encasing below the terminal plate; and releasing the spring part, such that the auxiliary terminal connector part is disposed on the auxiliary terminal area and such that the spring part engages the power terminal area besides the power terminal plate and runs to the auxiliary terminal area.

After that, the power terminal connector part may be attached to the power terminal plate by screwing the power terminal to the bus bar via a screw through the power terminal connector part and the power terminal plate. In such a way, a dry contact connection may be formed when the power terminal is screwed to the bus bar.

It has to be understood that two or more interconnecting members may be inserted in such a way into the housing, when two or more auxiliary terminals are needed.

Furthermore, an interconnecting member of the second type with a second power terminal connector part and a second auxiliary terminal connector part protruding from the second terminal connector part may be inserted into the housing for providing a further auxiliary terminal.

The interconnecting member of the first type and/or of the second type may be mounted in a simple manual assembly step. For example, two auxiliary emitter terminals may be provided with an interconnecting member of the first type connected to an AC power terminal of the power module and with an interconnecting member of the second type connected to the DC− power terminal. The mounting of the two interconnecting members may be performed in a simple manual assembly step, which may be done within approximately 20 seconds.

It has to be understood that features of the method and the use as described in the above and in the following may be features of the housing and/or the power module as described in the above and in the following.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
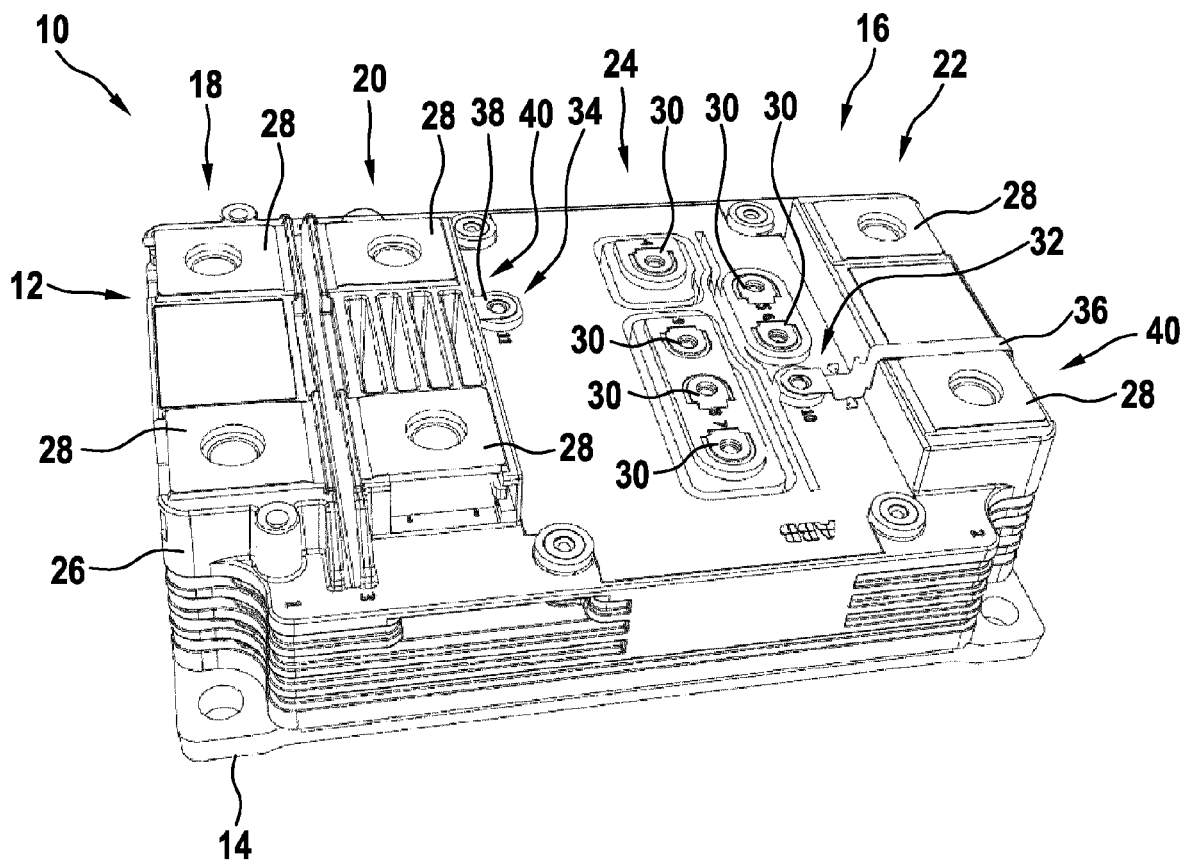
FIG. 1 shows a perspective view of a housing of a power module according to an embodiment of the invention.

FIG. 1 shows a power module 10 with a housing 12. Two semiconductor switches connected in series and forming a half-bridge may be accommodated inside the housing 12.

The housing 12 has a substantially rectangular base 14 and opposite to the base 14 a terminal side 16 with three power terminal areas 18, 20, 22 and an auxiliary terminal area 24. On one side of the housing 12, the DC+ terminal area 18 and the DC− terminal area 20 are arranged side by side. On the other side, the AC terminal area 22 is arranged. Between the AC terminal area 22 and the DC− terminal area 20, the auxiliary terminal area 24 is arranged.

The terminal areas 18, 20, 22, 24 may be provided as substantially plane faces of an encasing 26, which may be made of a plastics material. The auxiliary terminal area 24 may be a substantially planar face of the encasing 26, from which parts of the encasing protrude, on which the power terminal areas 18, 20, 22 are provided as planar faces. The power terminal areas 18, 20, 22 may be on the same level, higher than a level of the auxiliary terminal area 24.

On each power terminal area 18, 20, 22, two power terminal plates 28 are arranged, which provide an electrical contact for a power terminal. Each power terminal plate 28 is electrically connected via a conductor, which on one end may provide the power terminal plate 28, with at least one of the semiconductor switches in the encasing 26.

On the auxiliary terminal area 24, several fixed installed auxiliary terminals 30 are provided. The fixed installed auxiliary terminals 30 may provide electrical contacts to gates of the semiconductor switches, i.e. maybe gate terminals. They also may provide electrical contacts to emitters of the semiconductor switches, i.e. maybe auxiliary emitter terminals, which are in electrical contact with some of the power terminal plates 28. Furthermore, one or more of the auxiliary terminals 30 may provide an electrical contact to a temperature sensor and/or other sensors inside the housing 12.

Furthermore, two additional optionally installable auxiliary terminals 32, 34 are provided on the auxiliary terminal area 24. The auxiliary terminal 32 is provided by an interconnecting member 36 that is connected to a power terminal plate 28 on the AC terminal area 22. The auxiliary terminal 34 is provided by a differentially designed interconnecting member 38 that is connected to a power terminal plate 28 on the DC− terminal area 22. Thus, both auxiliary terminals 32, 34 may be auxiliary emitter terminals electrically connected to a low side semiconductor switch and a high side semiconductor switch of the half-bridge provided by the power module 10.

While the other auxiliary terminals 30 as well as the power terminals provided by the power terminal plates 18 may be undetachably connected to the encasing 26 and/or may be integrated into the encasing during manufacturing of the encasing 26, the interconnecting members 36, 38 may be mounted to the encasing 26 afterwards. In general, they are partially inserted into a slot or opening 40 below the respective power terminal plate 28.

Figure 2:
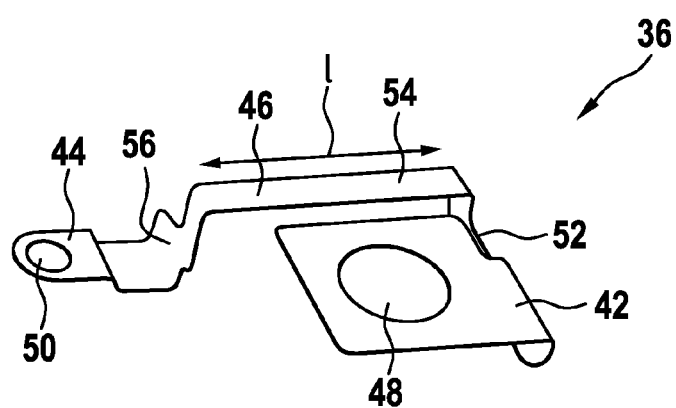
FIG. 2 shows a perspective view of an interconnecting member of first type for the housing of FIG. 1.
Figure 3:
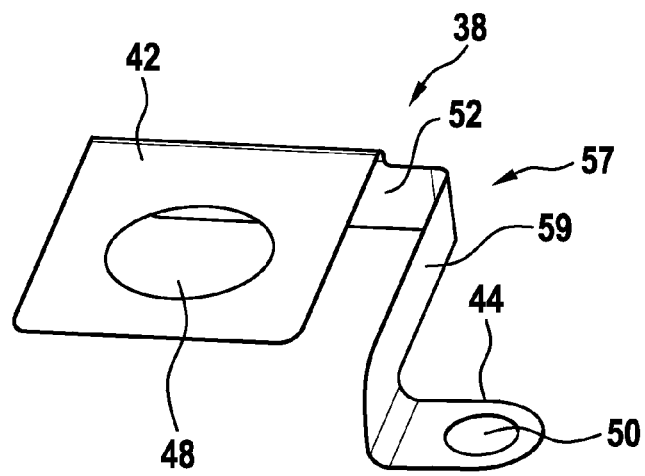
FIG. 3 shows a perspective view of an interconnecting member of second type for the housing of FIG. 1.

FIG. 2 shows the first interconnection member 36 and FIG. 3 shows the second interconnection member 38 in detail.

Both interconnection members 36, 38 may be stamped from a metal sheet and/or may be made of a spring steel alloy.

The interconnection member 36 of FIG. 2 comprises a power terminal connector part 42, an auxiliary terminal connector part 44 and a spring part 46. The power terminal connector part 42 may be a flat member with a hole 48 for a receiving screw. Also, the auxiliary terminal connector part 44 may be a flat member with a hole 50 for a receiving screw. The power terminal connector part 42 and the auxiliary terminal connector part 44 are interconnected with the spring part 46, which comprises a first section 52 attached to the power terminal connector part 42 and/or which is aligned substantially orthogonal to the power terminal connector part 42. The first section 52 may be used as stopper for preventing that the power terminal connector part 42 is inserted too deep into the opening 40.

The first section 52 of the spring part 46 is connected to a second section 54, which runs besides the power terminal connector part 42, however on a higher level than the power terminal connector part 42. When the interconnection member 36 has been inserted into the housing 12, the second section 54 runs besides the power terminal plate 28 and/or over the power terminal area 22.

At the end, the second section 54 is connected with an L-shaped third section 56 that is bent down to a level deeper than the power terminal connector part 42 and/or substantially on the same level than the auxiliary terminal connector part 44. It may be that the third section 56 has a part on a deeper level than the auxiliary terminal connector part 44, which may be disposed on a part of the housing slightly protruding from the auxiliary terminal area 24.

As is shown below with respect to FIGS. 5 to 8, the spring part 46 is elastically bent during the mounting procedure of the interconnection member 36, such that the auxiliary terminal connector part 44 can pass the power terminal area 22.

To make this mounting procedure possible, the interconnection member 36 needs to be designed with the needed flexibility. This may be achieved with the design shown in FIG. 2. The flexibility may be achieved by a flexible part of length l and plate thickness t. The maximum deflection that can be achieved without causing plastic deformation also depends on the material properties yield strength $\sigma_y$ and elastic modulus E.

When a plate of thickness t is bent upwards by a radius r, the material is stretched on its lower surface and is compressed on its upper surface. The strain E is defined by the geometry and is described by the following equation:

$$\epsilon = \frac{\frac{t}{2}}{r}$$

The stress $\sigma$ in the material close to the plate surface is then given by the elastic modulus E of the material:

$$\sigma = \epsilon E = \frac{t}{2r} E$$

If the stress a is larger than the yield strength $\sigma_y$, the material starts to deform plastically and the plate will not go back into its initial shape after deformation. This must be avoided by the design of the interconnection member 36. The following relation may be valid for the maximum bending possible (which may be defined as the inverse of a minimum radius $r_{min}$)

$$\frac{1}{t} \frac{\sigma_y}{E} = \frac{1}{2 r_{min}}$$

With this maximum bending, the maximum deflection of the spring part 46 is given by geometry. The cos expression is approximated by a quadratic approximation:

$$d_{max} = r_{min} - r_{min} \cdot \cos \frac{l}{r_{min}} \approx \frac{l^2}{2 r_{min}}$$

where $d_{max}$ is the maximal distance, the auxiliary terminal connector part 44 may be moved out of the position, where the spring part is not elastically bent and l is the length of the spring part 46.

Combined with the equation for the maximum bending this results in $$d_{max} \approx \frac{l^2}{t} \cdot \frac{\sigma_y}{E}$$

This can be converted into the following dimensionless equation:

$$\frac{d_{max}}{l} \approx \frac{l}{t} \cdot \frac{\sigma_y}{E}$$

The left side of the equation may be understood as a maximum deflection angle. The first factor on the right side is the aspect ratio of the bending element, i.e. the spring part 46, the second factor is the material property.

Typically, the length l is limited by the design of the power module 10 and/or the design of the power terminal area 22. The option to achieve a large enough deflection is having a very thin plate and having a very elastic material with high ratio of yield strength to elastic modulus.

For example, the interconnection member 36 may have a thickness of 0.15 mm and/or may be made of a spring steel alloy, such as X10CrNi18-8 (1.4310) in a half hard condition. The yield strength of the material is then about 400 MPa, the Vickers hardness is between HV 410 and HV 520, the elastic modulus is then about 200 GPa. With this combination, a desired deflection of approximately 10 mm may be achieved.

FIG. 3 shows the interconnection member 38, which may be made of the same material and/or may have the same thickness as the interconnection member 36.

The interconnection member 38 comprises a power terminal connector part 42 and an auxiliary terminal connector part 44, which may be formed like the ones of the interconnection member 38. However, the interconnection member 38 does not have a spring part 46 as the interconnection member 38 and/or the power terminal connector part 42 and the auxiliary terminal connector part 44 may be connected with each other with an L-shaped intermediate part 57. The intermediate part 57 comprises a first section 52 attached to the power terminal connector part 42 and/or which is aligned substantially orthogonal to the power terminal connector part 42. The first section 52 may be used as stopper for preventing that the power terminal connector part 42 is inserted too deep into the opening 40. Furthermore, the intermediate part 57 comprises a second section 59 attached to the auxiliary terminal connector part 44 and the first section 52. The second section 59 may be aligned substantially orthogonal to the power terminal connector part 42 and/or to the first section 52. The length and/or height of the second section 59 determine the position of the auxiliary terminal connector part 44 with respect to the auxiliary terminal area 24. The direction of the second section may be the insertion direction of the interconnection member 38 into the opening 40.

For example, as shown in FIG. 1, the interconnection member 38 may be inserted below a DC− power terminal plate 28 to provide an additional DC− auxiliary terminal 34. The interconnection member 38 may be inserted below the DC− power terminal plate 28 in an opening 40. The auxiliary terminal connector part 44 may then be disposed on an opening in the encasing 26, in which a nut is received. A conductor may be screwed through the hole 50 of the auxiliary terminal connector part 44 into the nut.

Figure 4:
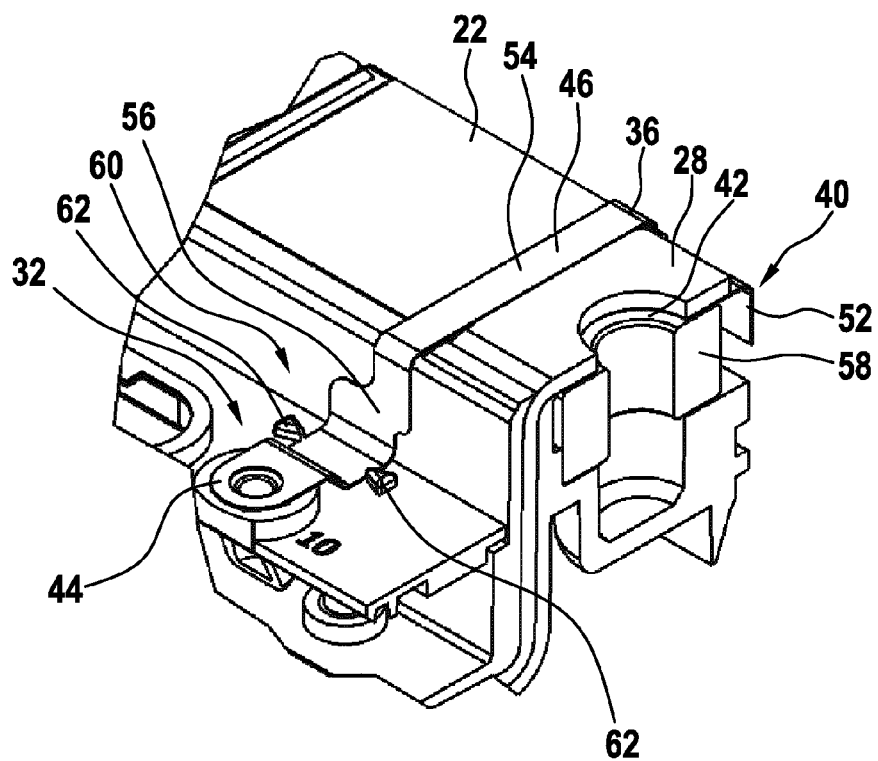
FIG. 4 shows a perspective cross-sectional view of a part of the housing of FIG. 1.

FIG. 4 shows a cross-section through the power module 10 of FIG. 1 at a power terminal plate 28 on the AC power terminal area 22. It can be seen that the interconnection member 36 is inserted below the power terminal plate 28 and above a nut 58. A conductor may be screwed through the holes in the power terminal plate 28 and the power terminal connector part 42 into the nut 58.

The auxiliary terminal connector part 44 provides the auxiliary terminal 32 on auxiliary terminal area 24 duplicating the AC power terminal provided by the power terminal plate 28. The auxiliary terminal connector part 44 may be disposed on a slightly elevated element on the auxiliary terminal area 24, below which a further nut may be positioned.

As shown in FIG. 4, a guidance structure 60 for positioning the auxiliary terminal connector part 44 on the auxiliary terminal area 24 is provided on the auxiliary terminal area 24. The guidance structure 60 comprises protrusions 62 protruding from the auxiliary terminal area 24, which may prevent the third section 56 of the spring part to move in a direction orthogonal to the extension direction of the third section 56 and second section 54 of the spring part 46.

FIGS. 5 to 8 show a part of the housing 12 of FIG. 1 during steps of a method for providing the housing 12 of a power module 10 with an auxiliary terminal 32.

FIG. 4 shows that the housing 12 has been provided with an encasing 26 for encasing semiconductor elements inside the housing 12. The encasing 26 provides a power terminal area 22, on which a power terminal plate 28 is provided and an auxiliary terminal area at a lower level than the power terminal area 22.

In general, the housing may be designed as described with respect to FIG. 1.

Furthermore, an interconnecting member 36 with a power terminal connector part 42 and an auxiliary terminal connector part 44 interconnected with a spring part 46 is provided. The spring part 46 is aligned besides the power terminal connector part 42 and the spring part 46 is bent, such that it at least partially runs on a higher level than the power terminal connector part 42.

In general, the interconnection member 36 may be designed as shown in FIG. 2.

Figure 5:
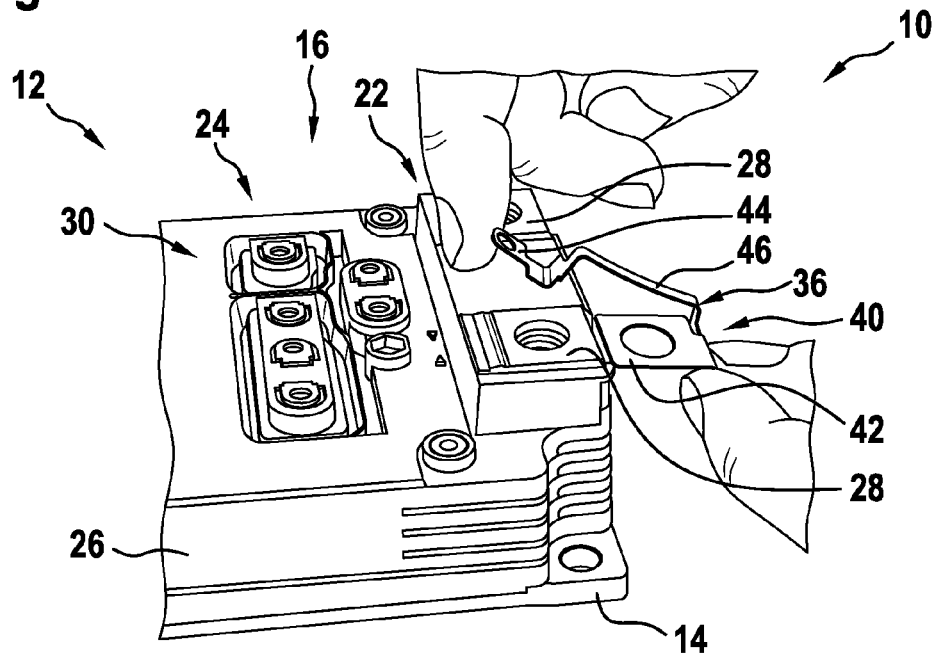
FIGS. 5 to 8 show perspective views of the housing of FIG. 1 during steps of a method according to an embodiment of the invention.

As shown in FIG. 5, the interconnection member 36 needs to be elastically deformed for mounting it to the housing 12.

The spring part 46 is elastically bent, such that the auxiliary terminal connector part 44 is at a higher level than the power terminal connector part 42. To this end, the interconnection member 36 may be held with one hand at the section 52 of the spring part 46 and the auxiliary terminal connector part 44 may be elevated with the other hand.

Figure 6:
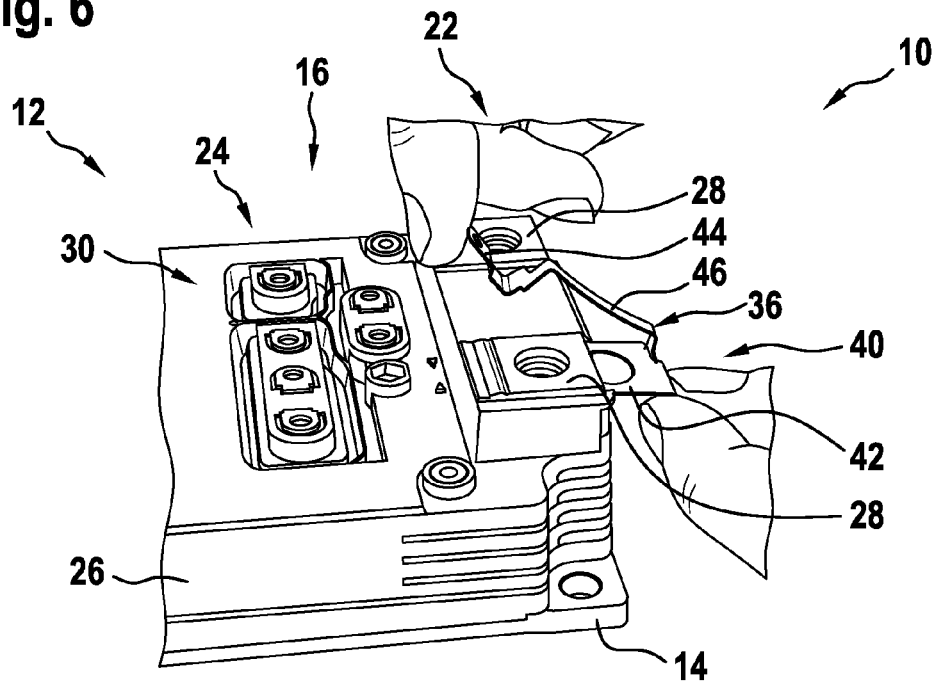

After that, as shown in FIG. 6, the interconnecting member 36 is inserted with the power terminal connector part 42 through an opening 40 in the encasing 26 below the power terminal plate 28. During the insertion, the spring part 46 stays elastically deformed. The auxiliary terminal connector part 44 is moved above the power terminal area 20, until it is positioned above the auxiliary terminal area 24.

Figure 7:
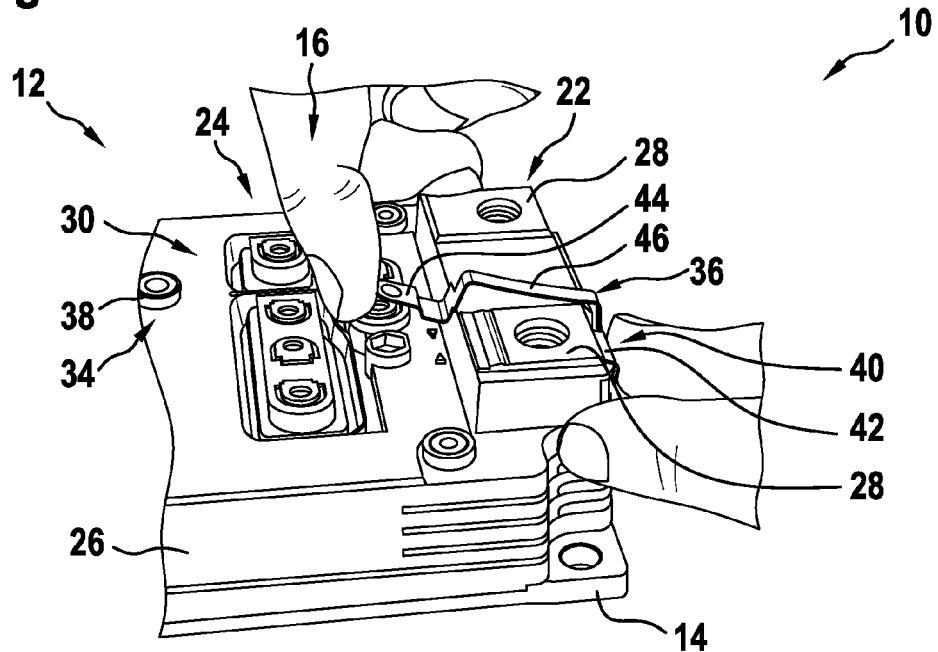

As shown in FIG. 7, when the power terminal connector part 42 has been completely inserted and/or the auxiliary terminal connector part 44 has reached a position above the auxiliary terminal area 24, the auxiliary terminal connector part 44 is moved to its final position.

The spring part 46 is released, such that the auxiliary terminal connector part 44 is disposed on the auxiliary terminal area 24 and such that the spring part 46 engages the power terminal area 22 besides the power terminal plate 28 and runs to the auxiliary terminal area 24.

Due to the elasticity of the spring part 46, the interconnection member 36 and/or the spring part 46 moves back into its initial shape and fits well to the intended position to provide the additional auxiliary terminal 32.

Figure 8:
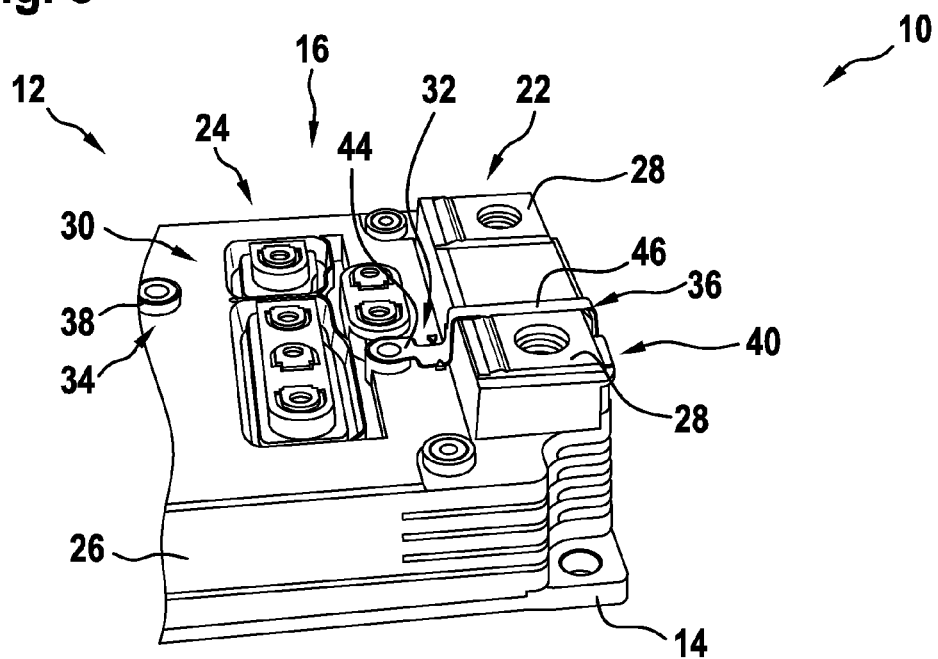

The final position of the interconnection member 36 is shown in FIG. 8. In the end, a conductor may be screwed to the power terminal provided by the power terminal plate 28, the nut 58 and the power terminal connector part 42.

When the power terminals provided by the power terminal plates 28 are connected to a bus bar, the power terminal connector part is clamped between the nut 58 and the power terminal plate 28 which results in a reliable connection.

Before or after the mounting of the interconnection member 36, the interconnection member 38 may be mounted to the power module 10 and/or its housing 12.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 power module
12 housing
14 base
16 terminal side
18 DC+ power terminal area
20 DC− power terminal area
22 AC power terminal area
24 auxiliary terminal area
26 encasing
28 power terminal plate
30 fixedly installed auxiliary terminal
32 first optionally installable auxiliary terminal
34 second optionally installable auxiliary terminal
36 first interconnecting member
38 second interconnecting member
40 opening
42 power terminal connector part
44 auxiliary terminal connector part
46 spring part
48 hole
50 hole
52 first section
54 second section
56 third section
57 L-shaped intermediate part
59 second section
58 nut
60 guidance structure
62 protrusions

The invention claimed is:

1. A housing of a power module, the housing comprising:
an encasing for encasing semiconductor elements inside the housing;
a power terminal area on the encasing, on which a power terminal plate is provided;
an auxiliary terminal area on the encasing at a lower level than the power terminal area;
an interconnecting member with a power terminal connector part and an auxiliary terminal connector part interconnected by a spring part, wherein the spring part is aligned besides the power terminal plate;
wherein the spring part is formed, such that it at least partially runs on a higher level than the power terminal connector part;
wherein the interconnecting member is inserted with the power terminal connector part through an opening in the encasing below the power terminal plate, such that the spring part engages the power terminal area besides the power terminal plate and runs to the auxiliary terminal area and the auxiliary terminal connector part is disposed on the auxiliary terminal area.

2. The housing of claim 1,
wherein the spring part is formed, such that the auxiliary terminal connector part is positioned at a lower level than the power terminal connector part.

3. The housing of claim 1,
wherein a guidance structure for positioning the auxiliary terminal connector part on the auxiliary terminal area is provided in at least one of the auxiliary terminal area and the power terminal area.

4. The housing of claim 3,
wherein the guidance structure comprises protrusions protruding from the auxiliary terminal area, between which protrusions the auxiliary terminal connector part is guided.

5. The housing of claim 1,
wherein a nut is positioned below the power terminal plate in the encasing and the power terminal connector part is positioned between the power terminal plate and the nut;
wherein the power terminal connector part and the power terminal plate comprise a hole for a screw.

6. The housing of claim 1,
wherein the auxiliary terminal connector part comprises a hole for a screw.

7. The housing of claim 1,
wherein the interconnecting member is made of sheet metal;
wherein the interconnecting member is made of a spring steel alloy.

8. The housing of claim 1,
wherein a thickness of the interconnecting member is between 0.1 mm and 0.2 mm;
wherein a Vickers hardness of the interconnecting member is at least HV 400.

9. The housing of claim 1,
wherein a ratio of a length of the spring part to a thickness of the interconnecting member is 250 to 1000 times larger than a ratio of an orthogonal distance between the power terminal area and the auxiliary terminal area to the length of the spring part.

10. The housing of claim 1,
wherein at least one further auxiliary terminal is provided on the auxiliary terminal area.

11. The housing claim 1, further comprising:
a second power terminal area on the encasing, on which a second power terminal plate is provided;
wherein the second power terminal area is at a higher level than the auxiliary terminal area;
wherein the second power terminal area is on a same level as the first power terminal area;
wherein the auxiliary terminal area is provided between the first power terminal area and the second power terminal area.

12. The housing of claim 11, further comprising:
a second interconnecting member with a second power terminal connector part and a second auxiliary terminal connector part protruding from the second terminal connector part;
wherein the second interconnecting member is inserted with the second power terminal connector part through a second opening in the encasing below the second power terminal plate, such that the second auxiliary terminal connector part is disposed on the auxiliary terminal area.

13. The housing of claim 12,
wherein the second interconnection member comprises an intermediate part interconnecting the second power terminal connector part and the second auxiliary terminal connector part;
wherein the intermediate part is aligned orthogonal to the second power terminal connector part and the second auxiliary terminal connector part.

14. A method of providing a housing of a power module with an auxiliary terminal, the method comprising:
providing the housing with an encasing for encasing semiconductor elements inside the housing, a power terminal area on the encasing, on which a power terminal plate is provided and an auxiliary terminal area on the encasing at a lower level than the power terminal area;
providing an interconnecting member with a power terminal connector part and an auxiliary terminal connector part interconnected with a spring part, wherein the spring part is aligned besides the power terminal connector part and wherein the spring part is formed, such that it at least partially runs on a higher level than the power terminal connector part;
elastically bending the spring part, such that the auxiliary terminal connector part is at a higher level than the power terminal connector part;
inserting the interconnecting member with the power terminal connector part through an opening in the encasing below the power terminal plate;
releasing the spring part, such that the auxiliary terminal connector part is disposed on the auxiliary terminal area and such that the spring part engages the power terminal area besides the power terminal plate and runs to the auxiliary terminal area.

15. The housing of claim 2, wherein a guidance structure for positioning the auxiliary terminal connector part on the auxiliary terminal area is provided in at least one of the auxiliary terminal area and the power terminal area.

16. The housing of claim 4,
wherein a nut is positioned below the power terminal plate in the encasing and the power terminal connector part is positioned between the power terminal plate and the nut;
wherein the power terminal connector part and the power terminal plate comprise a hole for a screw.

17. The housing of claim 16, wherein the auxiliary terminal connector part comprises a hole for a screw.

18. The housing of claim 16,
wherein the interconnecting member is made of sheet metal;
wherein the interconnecting member is made of a spring steel alloy;
wherein a thickness of the interconnecting member is between 0.1 mm and 0.2 mm; and
wherein a Vickers hardness of the interconnecting member is at least HV 400.

19. The housing claim 18,
wherein a ratio of a length of the spring part to a thickness of the interconnecting member is 250 to 1000 times larger than a ratio of an orthogonal distance between the power terminal area and the auxiliary terminal area to the length of the spring part.

20. The housing claim 19, further comprising:
a second power terminal area on the encasing, on which a second power terminal plate is provided;
wherein the second power terminal area is at a higher level than the auxiliary terminal area;

wherein the second power terminal area is on a same level as the first power terminal area; and wherein the auxiliary terminal area is provided between the first power terminal area and the second power terminal area.

\* \* \* \* \*